United States Patent
Nelson et al.

(10) Patent No.: US 9,772,353 B2
(45) Date of Patent: Sep. 26, 2017

(54) EQUIVALENT-TIME SAMPLING TECHNINQUE FOR NON-COHERENTLY MODULATED SIGNALS

(71) Applicant: Tektronix, Inc., Beaverton, OR (US)

(72) Inventors: Michael A. Nelson, Portland, OR (US); John E. Carlson, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 959 days.

(21) Appl. No.: 14/046,660

(22) Filed: Oct. 4, 2013

(65) Prior Publication Data

US 2014/0358464 A1    Dec. 4, 2014

Related U.S. Application Data

(60) Provisional application No. 61/830,952, filed on Jun. 4, 2013.

(51) Int. Cl.
| | | |
|---|---|---|
| *G01R 13/02* | (2006.01) | |
| *G01R 13/34* | (2006.01) | |
| *H04L 27/233* | (2006.01) | |

(52) U.S. Cl.
CPC ....... *G01R 13/345* (2013.01); *G01R 13/0272* (2013.01); *H04L 27/233* (2013.01)

(58) Field of Classification Search
CPC ...... H03D 7/00; H03D 7/1441; H03D 7/1475; H04B 1/16; H04B 1/0025; H04B 1/28;
(Continued)

(56) References Cited

U.S. PATENT DOCUMENTS 6,297,691 B1    10/2001    Anderson et al.
6,564,160 B2     5/2003    Jungerman et al.
(Continued)

FOREIGN PATENT DOCUMENTS

EP    1669764 A2    6/2006
WO    2010142811 A3    12/2010

OTHER PUBLICATIONS

Alain Barel, Validation of a Microwave Multitone Signal with Known Phase, 4 pages.
(Continued)

*Primary Examiner* — Roy Y Yi
(74) *Attorney, Agent, or Firm* — Marger Johnson; Andrew J. Harrington

(57) ABSTRACT

Aspects of the invention include an equivalent-time sampling oscilloscope that receives a carrier signal, the carrier signal after it has been modulated with a repeating data pattern, and a pattern trigger signal that is synchronous with the data pattern. The carrier signal and the modulation are asynchronous, that is, they are not phase-locked in any way. The oscilloscope simultaneously samples the modulated carrier signal and quadrature phases of the unmodulated carrier signal at a plurality of timebase delays relative to the pattern trigger signal, and a plurality of times at each timebase delay. After collecting this information, the oscilloscope uses the quadrature samples to calculate phases of the unmodulated carrier signal that correspond to the samples of the modulated carrier signal. The oscilloscope then calculates a stationary representation of the modulated carrier signal by selecting samples of the modulated carrier signal that correspond to a carrier signal phase progression that would have been observed if the unmodulated carrier signal had been synchronous with the pattern trigger signal.

7 Claims, 8 Drawing Sheets

(58) Field of Classification Search
CPC ...... H04B 5/0031; H04B 5/0037; H04B 7/12; H04B 10/2575; H04B 1/22; H04B 5/0093; H04B 10/116; H04B 10/25751; H04B 10/503
See application file for complete search history.

(56) References Cited

U.S. PATENT DOCUMENTS

| | | |
|---|---|---|
| 7,746,058 B2 | 6/2010 | Nelson et al. |
| 2002/0121892 A1 | 9/2002 | Vandersteen et al. |
| 2007/0164237 A1* | 7/2007 | Bernhardt ............ H01J 37/248 250/492.21 |
| 2012/0076183 A1* | 3/2012 | Dapper et al. ...... H03M 13/356 375/219 |
| 2013/0022149 A1* | 1/2013 | McCune, Jr. ......... H04L 27/361 375/298 |

OTHER PUBLICATIONS

Bernard Sklar, A Structured Overview of Digital Communications—a Tutorial Review—Part 1, IEEE Communications Magazine, 14 pages.

European Patent Office, Extended European Search Report for Application No. 14164870.9, 7 pages, Munich, Germany.

\* cited by examiner

EQUIVALENT-TIME SAMPLING TECHNINQUE FOR NON-COHERENTLY MODULATED SIGNALS

RELATED APPLICATION DATA

This application claims the benefit of U.S. Provisional Patent Application Ser. No. 61/830,952, filed Jun. 4, 2013, which is hereby incorporated by reference for all purposes.

FIELD OF THE INVENTION

This disclosure pertains to signal analysis, and more particularly to a new way to measure non-coherently modulated signals.

BACKGROUND

Many modulation standards use what is referred to as "non-coherent modulation". As shown in FIG. 1, non-coherently modulated signal 105 is formed by modulating carrier signal 110 with modulating signal 115 produced by symbol generator 120. Symbol generator 120 generates modulating signal 115 from symbol clock 125. Symbol clock 125 and carrier signal 110 are asynchronous, that is, they are not phase-locked in any way. Modulator 130 may modulate carrier signal's 110 amplitude, phase, or both depending on the particular modulation standard used.

Non-coherently modulated signals are typically measured using a real-time oscilloscope or a real-time spectrum analyzer. However, in some cases the bandwidth of these signals exceeds what is available from commercially available instruments. For example, some signals used in satellite communications have a carrier frequency of 60 GHz and multi-GHz of bandwidth. Such a signal is too high in frequency for a commercially available real-time oscilloscope, and too wideband for a commercially available real-time spectrum analyzer. An equivalent-time sampling oscilloscope has enough bandwidth to measure such a signal, but unfortunately a sampling scope requires that a signal under test be repetitive in order to produce a stationary single-valued waveform, and a non-coherently modulated signal is not repetitive. That is, even if the modulating signal is repetitive, the modulated carrier will not be repetitive because the symbol clock and the carrier signal are asynchronous.

A need remains for a way to address these and other problems associated with the prior art.

SUMMARY OF THE INVENTION

Aspects of the invention include an equivalent-time sampling oscilloscope that receives a carrier signal, the carrier signal after it has been modulated with a repeating data pattern, and a pattern trigger signal that is synchronous with the data pattern. The carrier signal and the modulation are asynchronous, that is, they are not phase-locked in any way. The oscilloscope simultaneously samples the modulated carrier signal and quadrature phases of the unmodulated carrier signal at a plurality of timebase delays relative to the pattern trigger signal, and a plurality of times at each timebase delay. After collecting this information, the oscilloscope uses the quadrature samples to calculate phases of the unmodulated carrier signal that correspond to the samples of the modulated carrier signal. The oscilloscope then calculates a stationary representation of the modulated carrier signal by selecting samples of the modulated carrier signal that correspond to a carrier signal phase progression that would have been observed if the unmodulated carrier signal had been synchronous with the pattern trigger signal.

DETAILED DESCRIPTION

Figure 1:
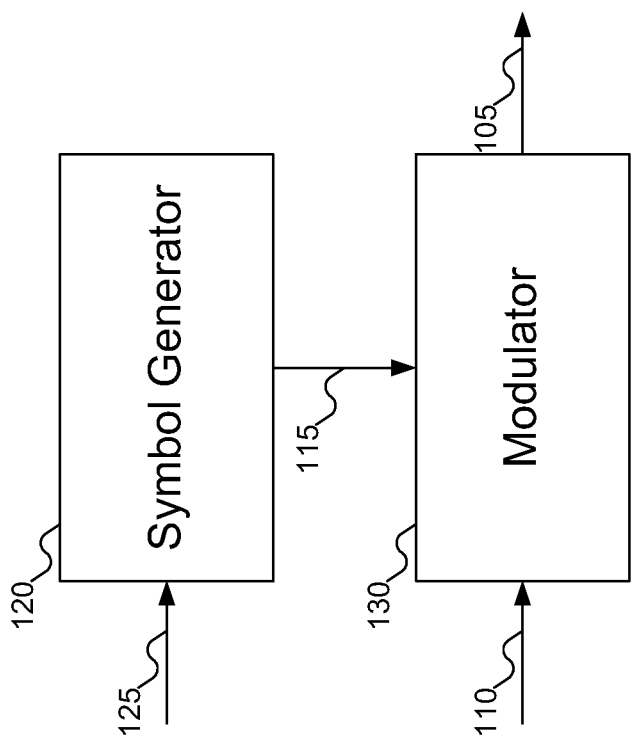
FIG. 1 shows generation of a modulated carrier signal in the prior art.
Figure 2:
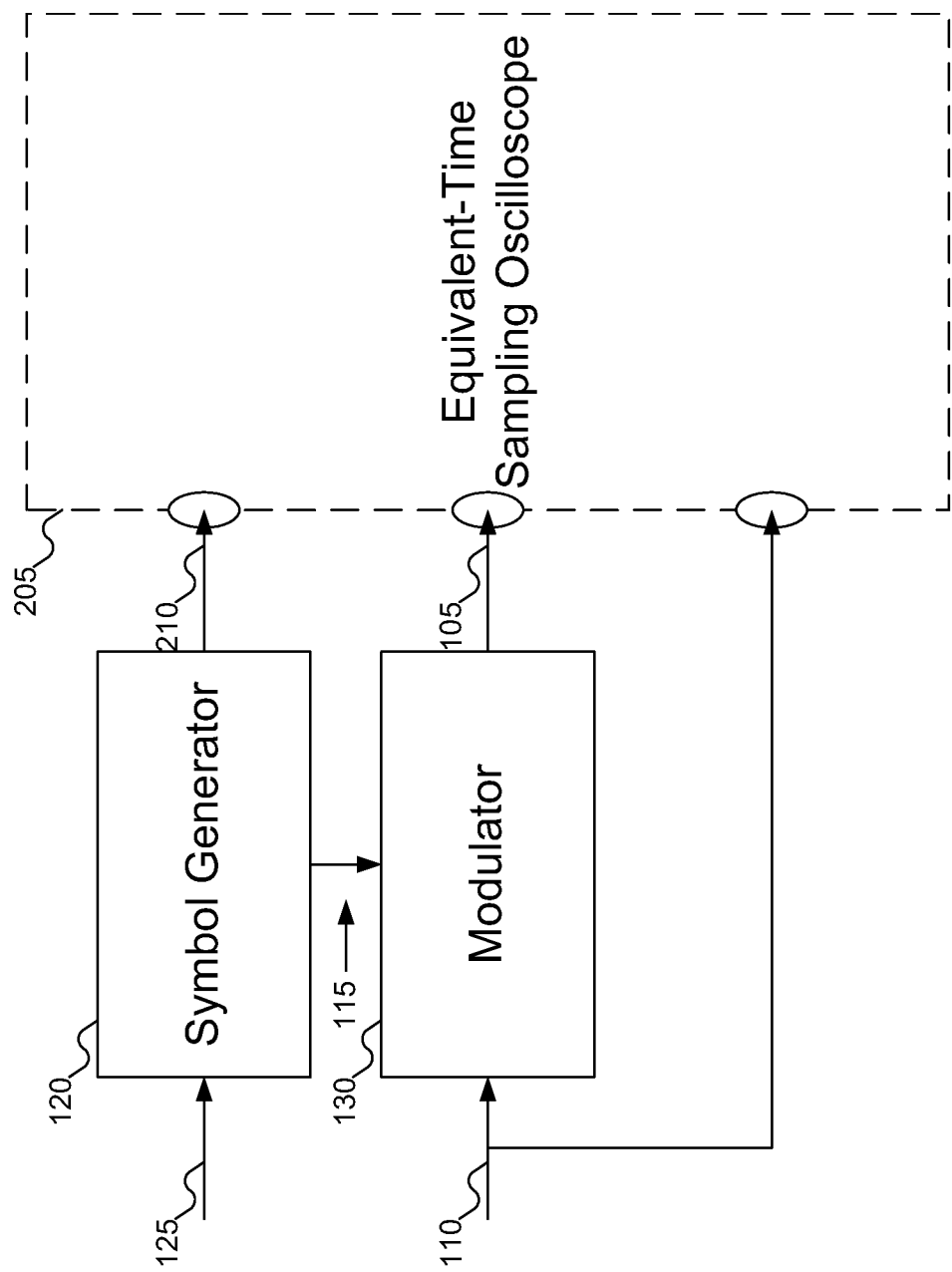
FIG. 2 shows a device receiving a modulated carrier signal, an unmodulated carrier signal, and a pattern trigger signal for analysis, according to an embodiment of the invention.

FIG. 2 shows a device 205 such as an equivalent-time sampling oscilloscope measuring a non-coherently modulated signal 105 according to an embodiment of the present invention. Symbol generator 120 receives symbol clock 125, and from it generates modulating signal 115, which is repetitive, and pattern trigger signal 210 that is synchronous with modulating signal 115. For example, if modulating signal 115 is a repeating data pattern, then pattern trigger signal 210 is synchronous with that repeating data pattern. Modulator 130 modulates carrier signal 110 according to modulating signal 115 to produce non-coherently modulated carrier signal 105. Device 205 also receives unmodulated carrier signal 110. The carrier signal and the modulating signal are asynchronous, that is, they are not phase-locked in any way. Note that, although modulating signal 115 is repetitive, modulating signal 115 is asynchronous with the carrier signal. Thus, resulting modulated carrier signal 105 is not coherent with pattern trigger signal 210. Thus, merely sampling modulated carrier signal 105 would not result in a stationary waveform. Although device 205 is described as an equivalent-time sampling oscilloscope, it should be appreciated that it may be any kind of test instrument, such as a real-time oscilloscope, a spectrum analyzer, a logic analyzer, a computer, or any other device that performs the desired analysis. Not shown in FIG. 2 are the internal components of device 205: processor, memory, etc.

In one embodiment of the invention, symbol generator 120 does not provide pattern trigger signal 210. In that case, the device 205 may generate its own pattern trigger signal by receiving the symbol clock and dividing it down. A person of ordinary skill in the art will recognize other ways in which pattern trigger signal 210 can be generated.

Figure 3:
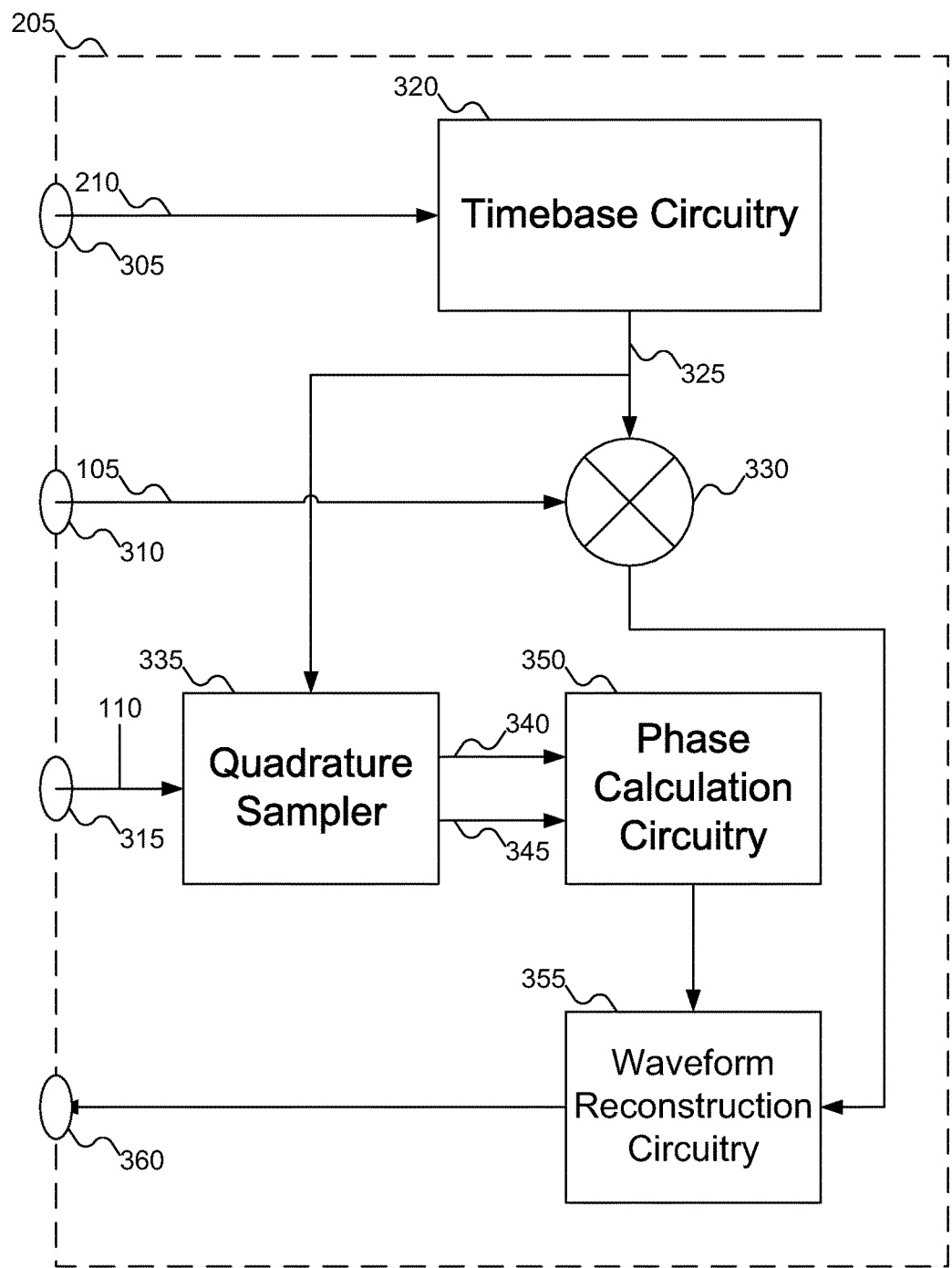
FIG. 3 shows details of the device of FIG. 2.

FIG. 3 shows details of the device of FIG. 2. In FIG. 3, inputs 305, 310, and 315 are shown, providing signals 210, 105, and 110 to other components of device 205. Pattern trigger signal 210 is provided to timebase circuitry 320, which, in response to an edge of pattern trigger signal 210, produces sampler strobe signal 325 after a programmable time delay. Sampler strobe signal 325 causes sampling circuit 330 and quadrature sampler 335 to simultaneously sample modulated carrier signal 105 and the quadrature phases of unmodulated carrier signal 110, respectively. These samples are then used to produce a stationary representation of the waveform of the modulated carrier signal, as will be explained in detail below.

Figure 4:
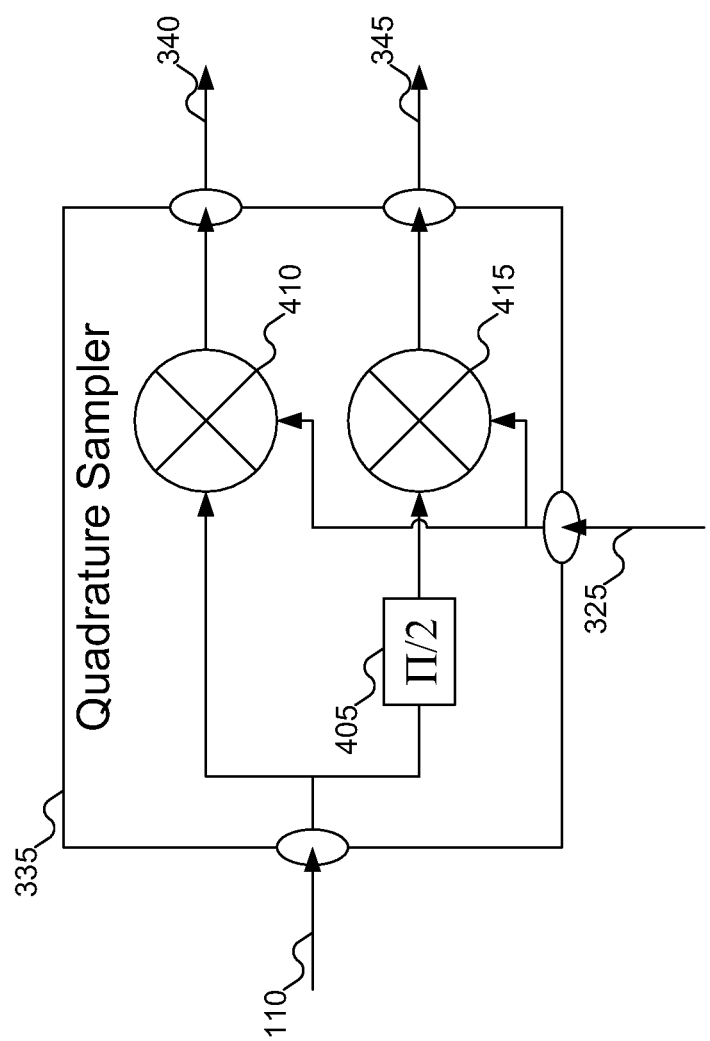
FIG. 4 shows details of the quadrature sampler of FIG. 3.

FIG. 4 shows details of quadrature sampler 335. Unmodulated carrier signal 110 is split into two phases, one of which is shifted by $\pi/2$ radians (90 degrees) by phase shifter 405, and then the two phases are sampled by sampling circuits 410, 415 to produce two quadrature samples 340, 345. Although FIG. 4 shows the quadrature phase being generated by phase shifter 405, it will be appreciated that the quadrature relationship may be generated in various other ways. For example, phase shifter 405 may instead be a time delay that delays one of the phases by the time equivalent of $\pi/2$ radians. Alternatively, the quadrature relationship may be created by delaying sampling strobe signal 325 to one of the samplers with a time delay (not shown). Note that, although the foregoing description refers to $\pi/2$ radians, other phase shift values may also be used provided that the phase calculations (described below) take this different phase value into account.

Returning to FIG. 3, in operation, device 205 collects information about the signals by simultaneously sampling modulated carrier signal 105 and the quadrature phases of unmodulated carrier signal 110 (1) at a plurality of timebase delays relative to pattern trigger signal 210, and (2) a plurality of times at each timebase delay. For example, the instrument might sample modulated carrier signal 105 (1) at 100 timesteps, each 100 ps apart, covering 10 ns after pattern trigger signal 210, and (2) 10,000 times at each timestep. The reason for the 10,000 samples will be explained momentarily. For now, suffice it to say that since modulated carrier signal 105 is asynchronous with pattern trigger signal 210, repeatedly sampling at each timestep means that the instrument is repeatedly sampling modulated carrier signal 105 at the same time location on the repeating data pattern, but modulated carrier signal 105 has a randomly fluctuating phase, so this is equivalent to random sampling in the carrier signal phase space.

Quadrature samples 340 and 345 are provided to Phase Calculation Circuitry 350, which uses them to calculate phases of unmodulated carrier signal 110 using the arctangent function or a similar mathematical function. Since the instrument sampled the quadrature phases and the modulated carrier signal simultaneously, the resulting calculated phases represent the phases of unmodulated carrier signal 110 at the same instants when modulated carrier signal 105 was sampled.

Figure 5:
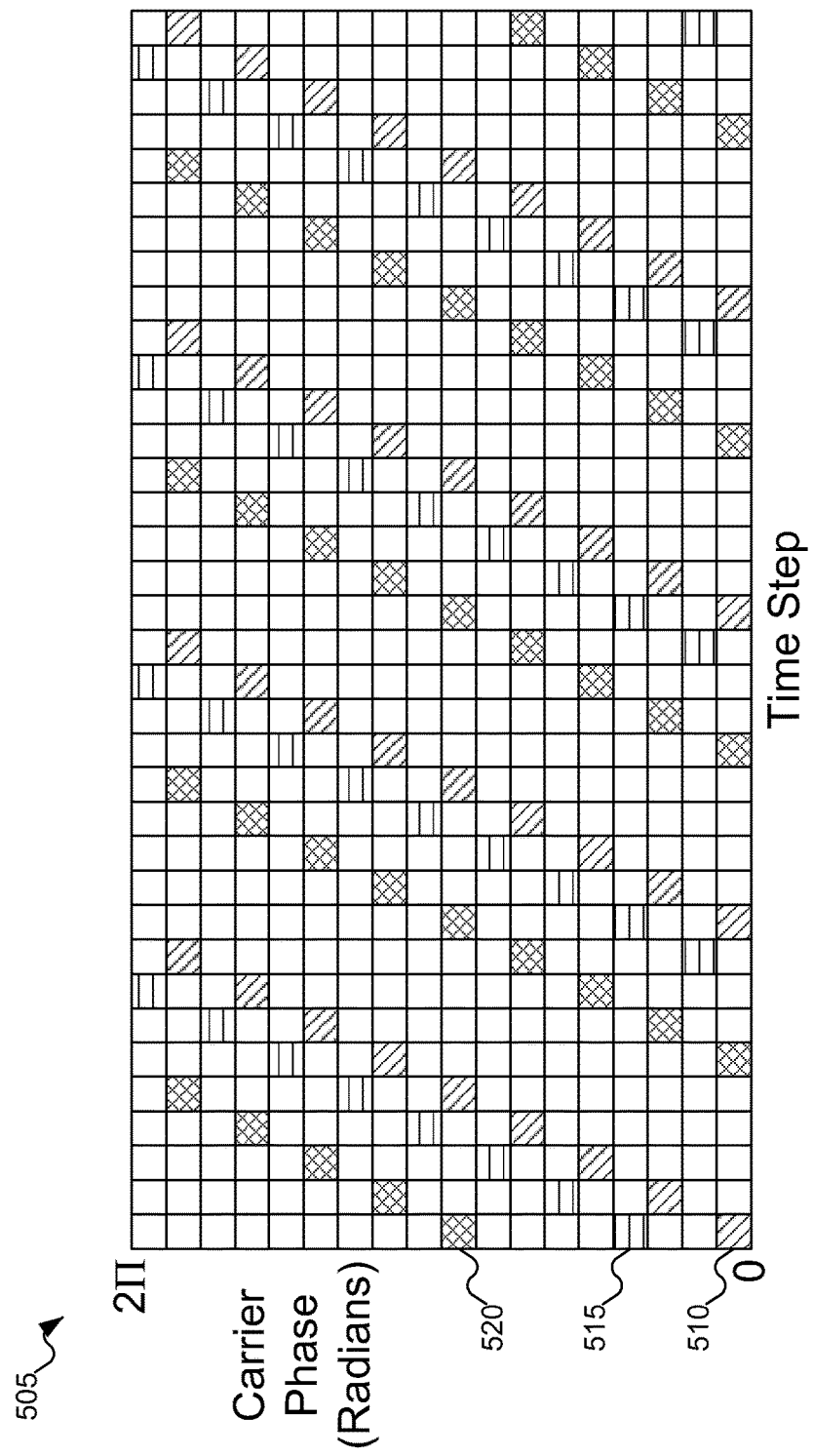
FIG. 5 shows a collection of samples of the modulated carrier signal, as can be used to calculate a stationary representation of the modulated carrier signal in the device of FIG. 2.
Figure 6:
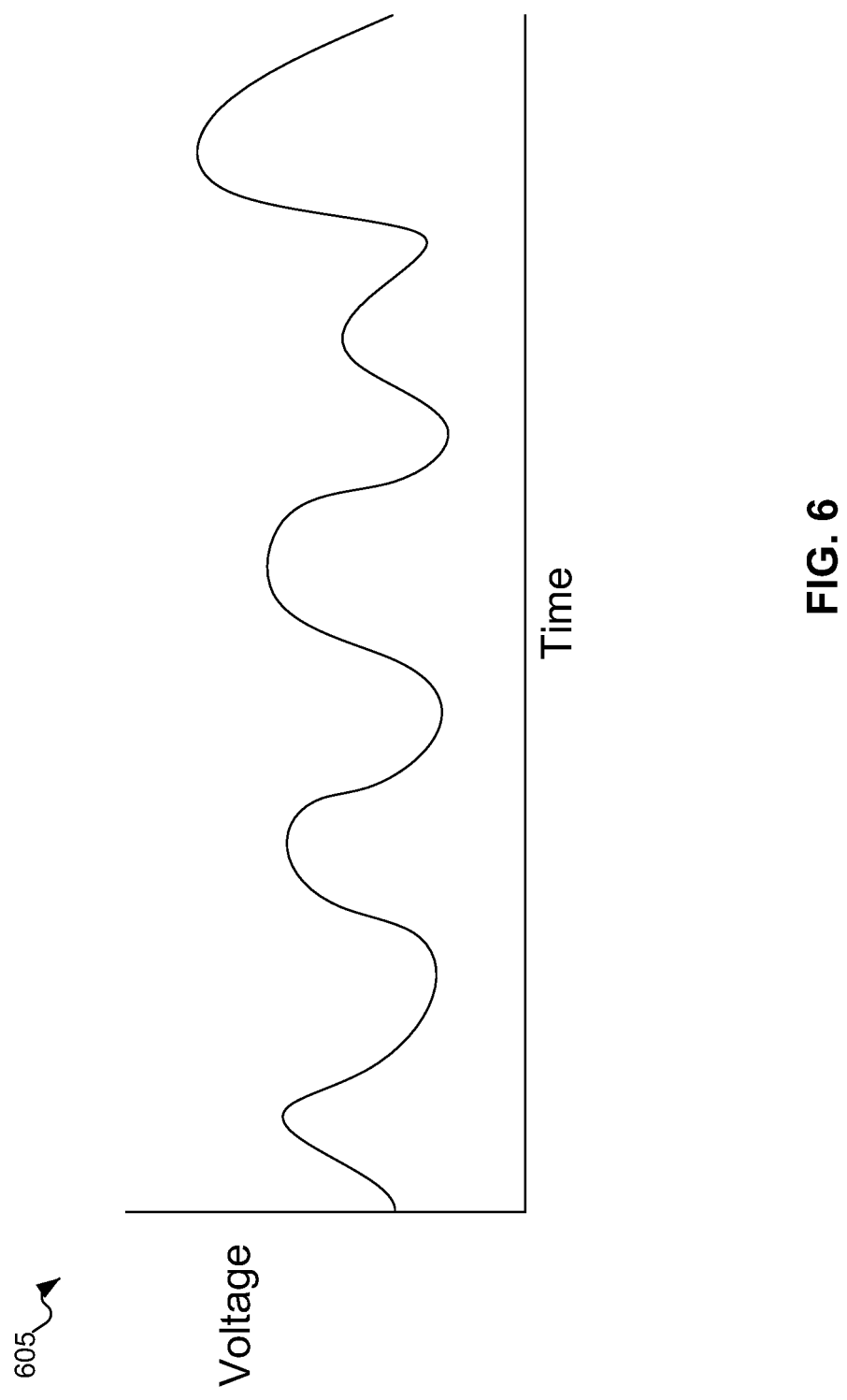
FIG. 6 shows a stationary representation of the modulated carrier signal produced using the device of FIG. 2.

Next, Waveform Reconstruction Circuitry 355 constructs a stationary representation of modulated carrier signal 105 by selecting those samples of the modulated carrier signal that correspond to a carrier signal phase progression that would have been observed if the unmodulated carrier signal had been synchronous with the pattern trigger signal. FIG. 5 illustrates one way to visualize this selection process. Graph 505 in FIG. 5 depicts a collection of samples of the modulated carrier signal on a two-dimensional graph, with the y-axis being the associated carrier signal phase, the x-axis being the time-step, and the z-axis being the sampled voltage value. Suppose that, for example, the carrier signal period and the timesteps are such that it takes 10 timesteps for the timebase to advance through one period of the carrier signal. For example, the timestep could be 10 ps, and the carrier signal could have a period of 100 ps, so that after 10 timesteps, the timebase has advanced through one period of the carrier signal. Thus, the Waveform Reconstruction Circuitry can construct a stationary representation of the modulated carrier signal by selecting the samples of the modulated carrier signal from the bins (1) timestep=0, phase=0× $2\pi/10$ radians, (2) timestep=1, carrier phase=1×$2\pi/10$ radians, (3) timestep=2, phase=2×$2\pi/10$ radians, and so on, indicated as points 510, which are depicted with a diagonal line fill pattern. The resulting selection of samples, when displayed on a graph of voltage versus time as shown on FIG. 6, is a depiction of the stationary waveform that would have been observed if the unmodulated carrier signal had been synchronous with the data pattern, and the initial carrier phase had been zero radians. Note that the choice of zero radians starting phase was arbitrary. The Waveform Reconstruction Circuitry could have started at any one of the other initial phase values, 0 to $2\pi$ radians, to produce various other waveforms, each being a stationary representation of the modulated carrier signal that would have been observed if the unmodulated carrier signal had been synchronous with the pattern trigger signal, the only difference being the phase of the carrier signal at the first timestep. Points 515 and 520, represented using horizontal stripe and angles cross-hatching fill patterns, respectively, depict two other such selection of points. In some embodiments, these different waveforms are all provided to the user for further analysis.

Returning to the reason for the 10,000 samples, recall that since the carrier signal is asynchronous with the pattern trigger signal, then when any sample of the modulated carrier signal is taken, that sample will have a random carrier signal phase. However, that carrier signal phase might not be the one that is needed to construct the waveform requested by the user. Thus, to ensure that sufficient phases are available for the waveform reconstruction process, the instrument takes a large number of samples at each timestep, such as 10,000. Doing so provides for a uniformly distributed (in the phase space) selection of samples to choose from. However, this also means that often there will be more than one sample for a given phase. Note that the question of "how many samples have the same phase" also depends on how coarsely one quantizes the carrier signal phase. That is, for example, it might be that a 1 ps phase resolution provides sufficient waveform fidelity for the reconstruction process. In that case, every sample with a phase value from, for example, 0.0 ps to 1.0 ps might go into one bin. In another case, it might be that a 0.1 ps phase resolution is necessary. In that case, every sample with a phase value from, for example, 0.0 ps to 0.1 ps might go into one bin. To deal with these multiple samples, in one embodiment of the invention, multiple samples with the same phase value are reconciled by selecting one such sample at random. In another embodiment of the invention, multiple samples with the same phase value are reconciled by averaging all such samples. A person skilled in the art will recognize other ways in which multiple samples can be used in constructing a waveform. It will also be appreciated that it may be sufficient to acquire fewer samples than 10,000, such as 1,000, or necessary to acquire even more samples, such as 100,000, depending on how asynchronous the carrier signal is with the pattern trigger signal (that is, whether there are any beat frequencies, etc.), and depending on the phase resolution that is necessary for the waveform reconstruction process. In some embodiments, the device calculates the sampled phases on-the-fly and stops acquiring samples when sufficient phases are available for the waveform reconstruction process.

Returning to FIG. 3, once Waveform Reconstruction Circuitry 355 completes its operation, there are several possibilities. In one embodiment, the waveform is displayed on a monitor that is part of device 205 (not shown in FIG. 3). In a second embodiment, the waveform is stored in storage somewhere in device 205 (again, not shown in FIG. 3). In a third embodiment, the waveform is output from device 205 to another machine, for display, storage, or further processing. If so, then the waveform is output via output port 360. A person skilled in the art will recognize other ways in which the waveform can be used.

Figure 7A:
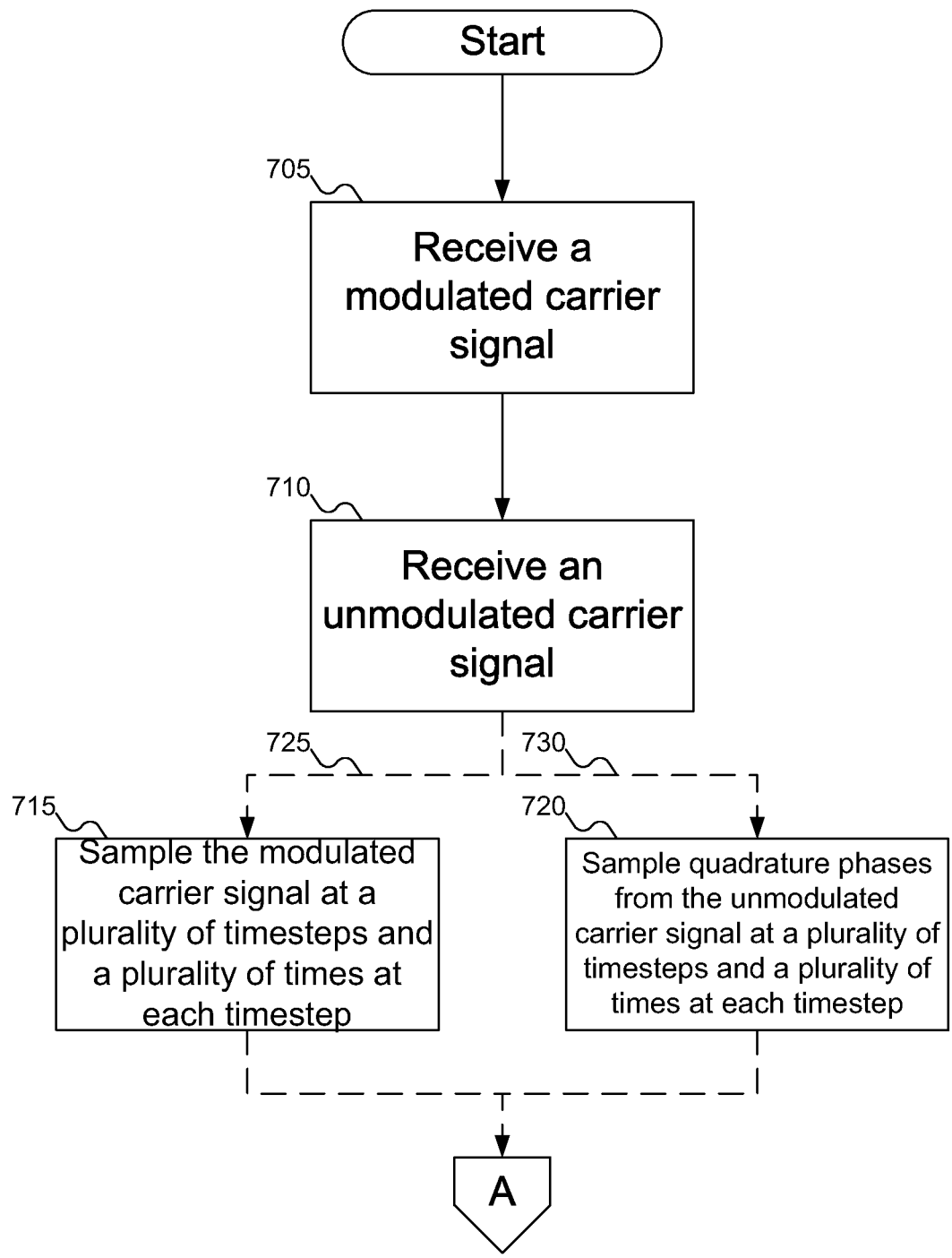
FIGS. 7A-7B show a flowchart of a procedure for using the device of FIG. 2, according to an embodiment of the invention.
Figure 7B:
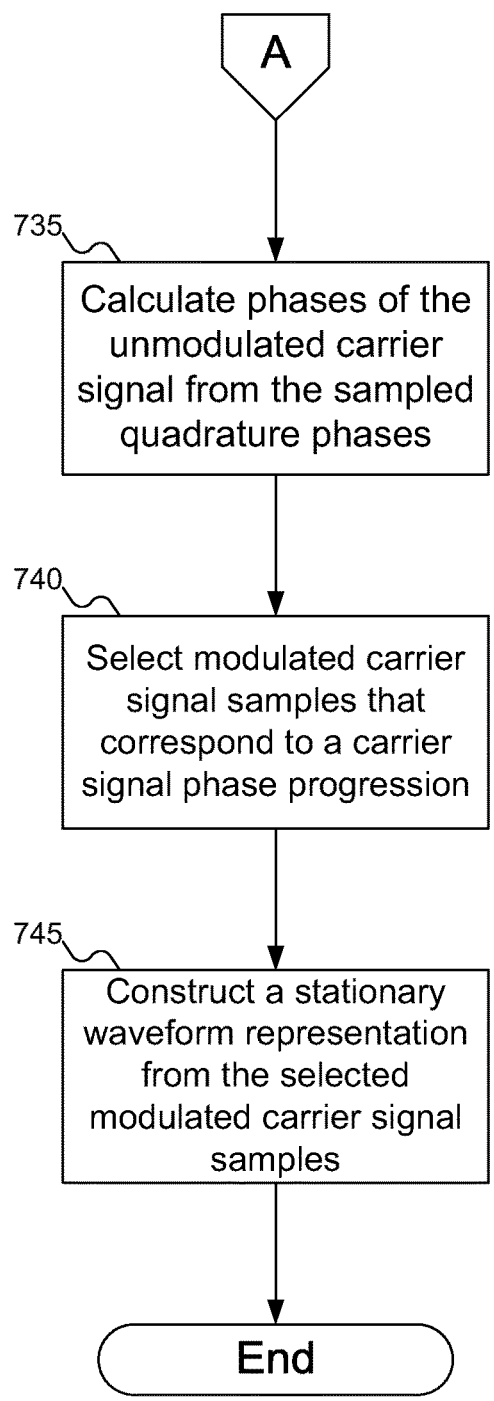

FIGS. 7A-7B show a flowchart of a procedure for using the device of FIG. 2, according to an embodiment of the invention. In FIG. 7A, at block 705, the device receives a modulated carrier signal. At block 710, the device receives an unmodulated carrier signal. While FIG. 7A suggests that blocks 705 and 710 are sequential, a person of ordinary skill in the art will recognize that the signals can be received at the same time or in either order. At block 715, the device samples the modulated carrier signal at a plurality of timesteps and, for each timestep, samples the modulated carrier signal a plurality of times. At block 720, the device samples quadrature phases from the unmodulated carrier signal at a plurality of timesteps and, for each timestep, samples the quadrature phases a plurality of times. Blocks 715 and 720 are performed simultaneously, as shown by dashed arrows 725 and 730.

At block 735 (FIG. 7B), the device calculates phases of the unmodulated carrier signal based on the sampled quadrature phases. At block 740, the device selects modulated carrier signal samples that correspond to a carrier signal phase progression. At block 745, the device constructs a stationary waveform from the selected modulated carrier signal samples.

There is one point worth elaborating on in the above description. The description indicates that the modulated carrier signal and the quadrature phases of the unmodulated carrier signal are sampled "simultaneously". This does not mean that the signals are sampled exactly simultaneously, as that level of precision is difficult to achieve, and is indeed not required for this invention. For example, it might be that the sampler strobe signal takes 100 ps longer to reach quadrature sampler 335 than it does to reach sampler 330, which means that the quadrature sampler always samples 100 ps after the signal sampler. This is perfectly acceptable for embodiments of this invention. Indeed, "simultaneously" means that the samples are taken in sync with respect to the same delay each time. Provided that the delay between the sampling of the two signals is substantially consistent, the sampling can be considered to be "simultaneous".

The flowcharts described above represent various possible embodiments of the invention. Embodiments of the invention are not limited to those shown in the flowcharts. Various blocks can be omitted, and the order of blocks can be rearranged, without loss of generality to embodiments of the invention.

The following discussion is intended to provide a brief, general description of a suitable machine in which certain aspects of the invention can be implemented. Typically, the machine includes a system bus to which is attached processors, memory, e.g., random access memory (RAM), read-only memory (ROM), or other state preserving medium, storage devices, a video interface, and input/output interface ports. The machine can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, or a system of communicatively coupled machines or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine can include embedded controllers, such as programmable or non-programmable logic devices or arrays, Application Specific Integrated Circuits, embedded computers, smart cards, and the like. The machine can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciated that network communication can utilize various wired and/or wireless short range or long range carriers and protocols, including radio frequency (RF), satellite, microwave, Institute of Electrical and Electronics Engineers (IEEE) 810.11, Bluetooth, optical, infrared, cable, laser, etc.

The invention can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the invention with reference to illustrated embodiments, it will be recognized that the illustrated embodiments can be modified in arrangement and detail without departing from such principles. And, though the foregoing discussion has focused on particular embodiments, other configurations are contemplated. In particular, even though expressions such as "in one embodiment" or the like are used herein, these phrases are meant to generally reference embodiment possibilities, and are not intended to limit the invention to particular embodiment configurations. As used herein, these terms can reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as can come within the scope and spirit of the following claims and equivalents thereto.

What is claimed is:

1. A test and measurement device, comprising:
   a first input port to receive an unmodulated carrier signal of a modulated signal to be measured by the test and measurement device;
   a second input port to receive the modulated carrier signal, the modulated carrier signal being a version of the unmodulated carrier signal that has been modulated by a modulating signal, the modulating signal being repetitive, and the modulating signal being asynchronous with the unmodulated carrier signal;

timebase circuitry to cause three sampling circuits to simultaneously sample the modulated carrier signal and quadrature phases of the unmodulated carrier signal at a plurality of timesteps relative to a pattern trigger signal that is synchronous with the modulating signal and a plurality of times at each timestep;

phase calculation circuitry to calculate phases of the unmodulated carrier signal from the sampled quadrature phases; and waveform reconstruction circuitry to construct a stationary representation of the modulated carrier signal by selecting samples of the modulated carrier signal that correspond to a carrier signal phase progression that would have been observed if the unmodulated carrier signal had been synchronous with the pattern trigger signal.

2. The test and measurement device according to claim 1, wherein the device is an equivalent-time sampling oscilloscope.

3. The test and measurement device according to claim 1, wherein the pattern trigger signal is derived from a symbol clock.

4. A method, comprising:

receiving, at respective input ports of a test and measurement device, a modulated carrier signal, an unmodulated carrier signal, and a pattern trigger signal that is synchronous with a modulating signal, the modulated carrier signal being a version of the unmodulated carrier signal that has been modulated by the modulating signal, the modulating signal being repetitive, and the modulating signal being asynchronous with the unmodulated carrier signal;

simultaneously sampling the modulated carrier signal and quadrature phases of the unmodulated carrier signal at a plurality of timesteps relative to the pattern trigger signal and a plurality of times at each timestep;

calculating phases of the unmodulated carrier signal from the sampled quadrature phases; and constructing a stationary representation of the modulated carrier signal by selecting samples of the modulated carrier signal that correspond to a carrier signal phase progression that would have been observed if the unmodulated carrier signal had been synchronous with the pattern trigger signal.

5. A method according to claim 4, wherein receiving, at respective input ports of a test and measurement device, a modulated carrier signal, an unmodulated carrier signal, and a pattern trigger signal includes deriving the pattern trigger signal from a symbol clock.

6. A method according to claim 4, wherein simultaneously sampling the modulated carrier signal and quadrature phases of the unmodulated carrier signal at a plurality of timesteps relative to the pattern trigger signal and a plurality of times at each timestep includes using timebase circuitry to cause three sampling circuits to sample the modulated carrier signal and quadrature phases of the unmodulated carrier signal.

7. An article, comprising a non-transitory storage medium, said non-transitory storage medium having stored thereon instructions that, when executed by a test and measurement machine, result in:

receiving, at respective input ports of the test and measurement machine, a modulated carrier signal, an unmodulated carrier signal, and a pattern trigger signal that is synchronous with a modulating signal, the modulated carrier signal being a version of the unmodulated carrier signal that has been modulated by the modulating signal, the modulating signal being repetitive, and the modulating signal being asynchronous with the unmodulated carrier signal;

simultaneously sampling the modulated carrier signal and quadrature phases of the unmodulated carrier signal at a plurality of timesteps relative to the pattern trigger signal and a plurality of times at each timestep;

calculating phases of the unmodulated carrier signal from the sampled quadrature phases; and constructing a stationary representation of the modulated carrier signal by selecting samples of the modulated carrier signal that correspond to a carrier signal phase progression that would have been observed if the unmodulated carrier signal had been synchronous with the pattern trigger signal.

* * * * *